(12) United States Patent
Liu

(10) Patent No.: US 12,270,836 B1
(45) Date of Patent: Apr. 8, 2025

(54) CIRCUIT AND METHOD OF ADJUSTING CONDUCTION PERIOD FOR ENERGY-RECYCLING CIRCUIT

(71) Applicant: xMEMS Labs, Inc., Santa Clara, CA (US)

(72) Inventor: Jing-Meng Liu, San Jose, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/928,210

(22) Filed: Oct. 28, 2024

Related U.S. Application Data

(60) Provisional application No. 63/547,149, filed on Nov. 3, 2023.

(51) Int. Cl.
*G01R 19/165* (2006.01)
*G01R 19/04* (2006.01)

(52) U.S. Cl.
CPC ....... *G01R 19/16585* (2013.01); *G01R 19/04* (2013.01); *G01R 19/16533* (2013.01); *G01R 19/16576* (2013.01)

(58) Field of Classification Search
None
See application file for complete search history.

(56) References Cited

U.S. PATENT DOCUMENTS

2022/0021304 A1* 1/2022 Liu .............. H02M 1/08

* cited by examiner

*Primary Examiner* — Jas A Sanghera
(74) *Attorney, Agent, or Firm* — Winston Hsu

(57) ABSTRACT

A period determination circuit for determining conduction period for energy-recycling circuit includes an indication circuit, coupled to an inductor of the energy-recycling circuit to receive an inductor voltage, configured to generate an indication signal according to the inductor voltage, wherein the indication signal reflects a status corresponding to a first conduction period of the energy-recycling circuit; and a control signal generator, coupled to a switch of the energy-recycling circuit, configured to generate a control signal with a second conduction period for the switch according to the indication signal. The energy-recycling circuit is coupled to a first capacitive component and a second capacitive component. The energy-recycling circuit comprises the inductor and the switch coupled between the first capacitive component and the second capacitive component. The control signal generator determines the second conduction period according to the first conduction period and the indication signal.

26 Claims, 9 Drawing Sheets

CIRCUIT AND METHOD OF ADJUSTING CONDUCTION PERIOD FOR ENERGY-RECYCLING CIRCUIT

CROSS REFERENCE TO RELATED APPLICATIONS

This application claims the benefit of U.S. Provisional Application No. 63/547,149, filed on Nov. 3, 2023. The content of the application is incorporated herein by reference.

BACKGROUND OF THE INVENTION

1. Field of the Invention

The present application relates to a circuit and a method of determining conduction period for energy-recycling circuit.

2. Description of the Prior Art

Unless otherwise indicated herein, the approaches described in this section are not prior art to the claims in this application and are not admitted as prior art by inclusion in this section.

Energy-recycling circuit, exploiting LC oscillations, has been used within driving circuit for driving capacitive load(s) especially when swapping voltages is desirable (e.g., please see U.S. Pat. No. 11,057,692, application Ser. No. 18/396,678 and U.S. Pat. No. 12,107,546), having benefit of reducing power consumption. The energy-recycling circuit basically comprises an inductor and a switch coupled between a first capacitive component and a second capacitive component with certain capacitance. During conduction period, the energy-recycling circuit would form a current from one capacitive component to another, so as to recycle electrical energy stored in one capacitive component.

During the conduction period, magnitude of the current would decrease and may eventually return to zero when the conduction period is sufficiently long. If the conduction period is too long, a reverse current will be formed, due to the property of LC oscillation.

Conduction period cannot be too short; otherwise there would be residual charges (electrical energy) which may not be fully recycled. On the other hand, conduction period cannot be too long; otherwise, as mentioned earlier, reverse current will be formed which is not desirable. Hence, determining conduction period for energy-recycling is a critical problem.

Furthermore, in some application scenario, the capacitance thereof is not constant, which causes conduction period determination even more challenging.

Therefore, how to determine conduction period for energy-recycling circuit is a significant objective in the field.

SUMMARY OF THE INVENTION

It is therefore a primary objective of the present application to provide a circuit and a method of determining conduction period for energy-recycling circuit.

An embodiment of the present invention discloses a period determination circuit for determining a conduction period for an energy-recycling circuit. The period determination circuit comprises an indication circuit, coupled to an inductor of the energy-recycling circuit to receive an inductor voltage, configured to generate an indication signal according to the inductor voltage, wherein the indication signal reflects a status corresponding to a first conduction period of the energy-recycling circuit; and a control signal generator, coupled to a switch of the energy-recycling circuit, configured to generate a control signal with a second conduction period for the switch according to the indication signal. The energy-recycling circuit is coupled to a first capacitive component and a second capacitive component. The energy-recycling circuit comprises the inductor and the switch coupled between the first capacitive component and the second capacitive component. The control signal generator determines the second conduction period according to the first conduction period and the indication signal.

Another embodiment of the present invention discloses a period determination method of determining a conduction period for an energy-recycling circuit. The period determination method comprises receiving an inductor voltage corresponding to an inductor of the energy-recycling circuit; generating an indication signal according to the inductor voltage, wherein the indication signal reflects a status corresponding to a first conduction period of the energy-recycling circuit; determining a second conduction period according to the first conduction period and the indication signal; and generating a control signal with the second conduction period for a switch of the energy-recycling circuit according to the indication signal; wherein the energy-recycling circuit is coupled to a first capacitive component and a second capacitive component; wherein the energy-recycling circuit comprises the inductor and the switch coupled between the first capacitive component and the second capacitive component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
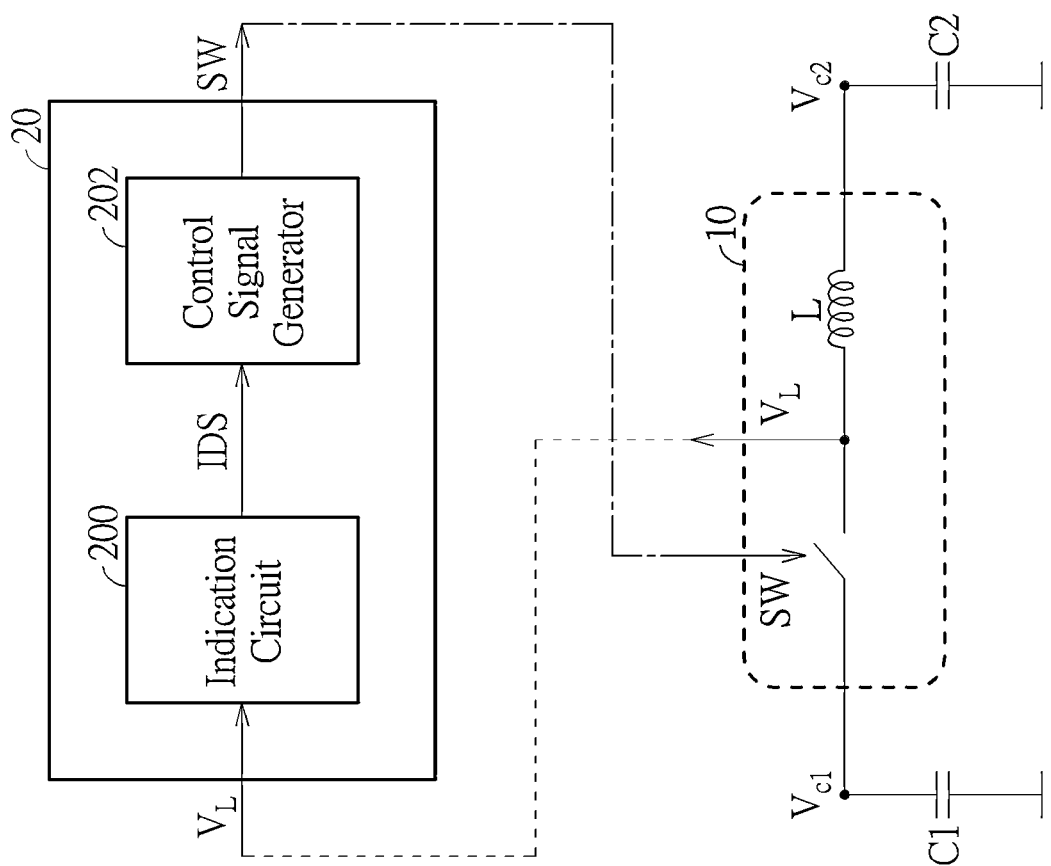
FIG. 1 is a schematic diagram of a period determination circuit coupled to an energy-recycling circuit according to an embodiment of the present application.

FIG. 1 is a schematic diagram of a period determination circuit 20 coupled to an energy-recycling circuit 10 according to an embodiment of the present application. The energy-recycling circuit 10 basically comprises an inductor L and a switch SW coupled between a first capacitive component C1 and a second capacitive component C2. The capacitive component may be capacitor or component with certain capacitance, and C1/C2 may also represent their capacitance.

The period determination circuit 20 is configured to generate a control signal (also denoted as SW) to the switch SW of the energy-recycling circuit 10. In other words, the period determination circuit 20 determines a conduction period $T_{on}$ for the switch SW or for the energy-recycling circuit 10, via the control signal SW.

In the present application, switch and the associated control signal share the same notation. In addition, node (within circuit) and the associated voltage share the same notation as well.

Once the switch SW is conducted and turned on, the energy-recycling circuit 10 would initiate an LC oscillation. Suppose a (first) voltage $V_{c1}$ corresponding to the first capacitive component C1 is greater than a (second) voltage $V_{c2}$ corresponding to the second capacitive component C2, i.e., $V_{c1} > V_{c2}$, at the first place (at an initial instant of the switch SW being conducted), an inductor current $I_L$ is formed from C1 to C2. As the switch SW remaining be conducted, a magnitude of the inductor current $I_L$ is gradually decreasing to zero and current direction of the inductor current $I_L$ will be subsequently reversed.

An objective of the period determination circuit 20 is to determine or adaptively adjust conduction period $T_{on}$ as optimal as possible. In an embodiment, an optimal conduction period $T_{on}$ shall be the longest period before the inductor current is reversed. The conduction period being too short may mean that there are residual charges remained in C1 at end of conduction period. The conduction period being too long may mean that the switch SW is cutoff after reversion of inductor current occurs.

The period determination circuit 20 comprises an indication circuit 200 and a control signal generator 202. The indication circuit 200 is coupled to the inductor L of the energy-recycling circuit 10 to receive an inductor voltage $V_L$ from the inductor L. The control signal generator 202 generates the control signal SW to the switch SW.

The indication circuit 200 is configured to generate an indication signal IDS according to the inductor voltage $V_L$, where the indication signal IDS reflects a status corresponding to a current (first) conduction period, denoted as $T_{on,n}$, of the energy-recycling circuit 10, where $T_{on,n}$ may represent conduction period corresponding to the $n^{th}$ energy-recycling operation. In an embodiment, the indication signal IDS may indicate the current conduction period $T_{on,n}$ is too short or too long.

The control signal generator 202 is configured to generate the control signal SW with a next/subsequent (second) conduction period, denoted as $T_{on,n+1}$, for the switch SW according to the indication signal IDS, where $T_{on,n+1}$ may represent conduction period corresponding to the $(n+1)^{th}$ energy-recycling operation, subsequent to the $n^{th}$ energy-recycling operation.

In an embodiment, when the indication signal IDS indicates the current conduction period $T_{on,n}$ is too short, the control signal generator 202 may adjust or, more specifically, lengthens the conduction period such that $T_{on,n+1} > T_{on,n}$ and generate the control signal SW with lengthened conduction period $T_{on,n+1}$ with $T_{on,n+1} > T_{on,n}$. On the other hand, when the indication signal IDS indicates the current conduction period $T_{on,n}$ is too long, the control signal generator 202 may adjust or, more specifically, shortens the conduction period such that $T_{on,n+1} < T_{on,n}$ and generate the control signal SW with shortened conduction period $T_{on,n+1}$ with $T_{on,n}$.

Figure 2:
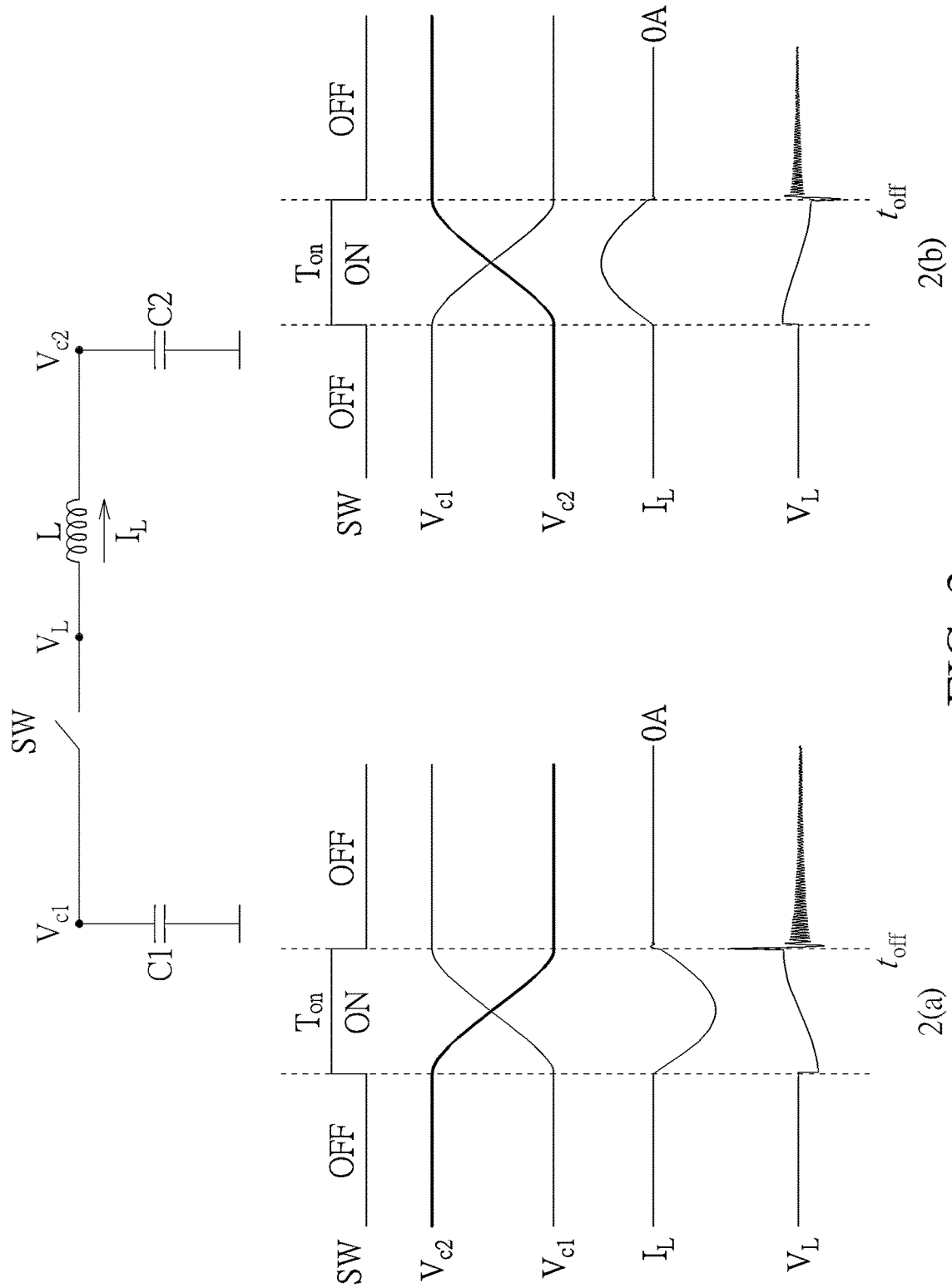
FIG. 2 illustrates an inductor current and the inductor voltage associated with voltages and control signal when the conduction period is too short.

FIG. 2 illustrates an inductor current $I_L$ and the inductor voltage $V_L$ associated with voltages $V_{c1}$, $V_{c2}$ and control signal SW when the conduction period $T_{on}$ is too short. In FIG. 2 the inductor current $I_L$ from C1 to C2 is regarded as positive. In FIG. 2(a), at a beginning of the conduction period $T_{on}$, $V_{c2} > V_{c1}$, the inductor current flows from C2 to C1 and $I_L$ is negative. Given the switch is coupled between the inductor L and the first capacitive component C1, if the conduction period $T_{on}$ is too short, at the time the switch SW is turned off (denoted as $t_{off}$ in FIG. 2), there is some residual inductor current flowing from C2 to a node denoted as $V_L$. Note that, node $V_L$ has some parasitic capacitance, which is much less than C1, and the inductor current at the time $t_{off}$ would produce a high/positive voltage spike on node or inductor voltage $V_L$, as illustrated in FIG. 2(a).

Similarly, in FIG. 2(b), at a beginning of the conduction period $T_{on}$, $V_{c2} < V_{c1}$ and the inductor current flows from C1 to C2 and $I_L$ is positive. If the conduction period $T_{on}$ is too short, at the time $t_{off}$, at which the switch SW is turned off, the positive residual inductor current would produce a low/negative voltage spike on $V_L$, as illustrated in FIG. 2(b).

Figure 3:
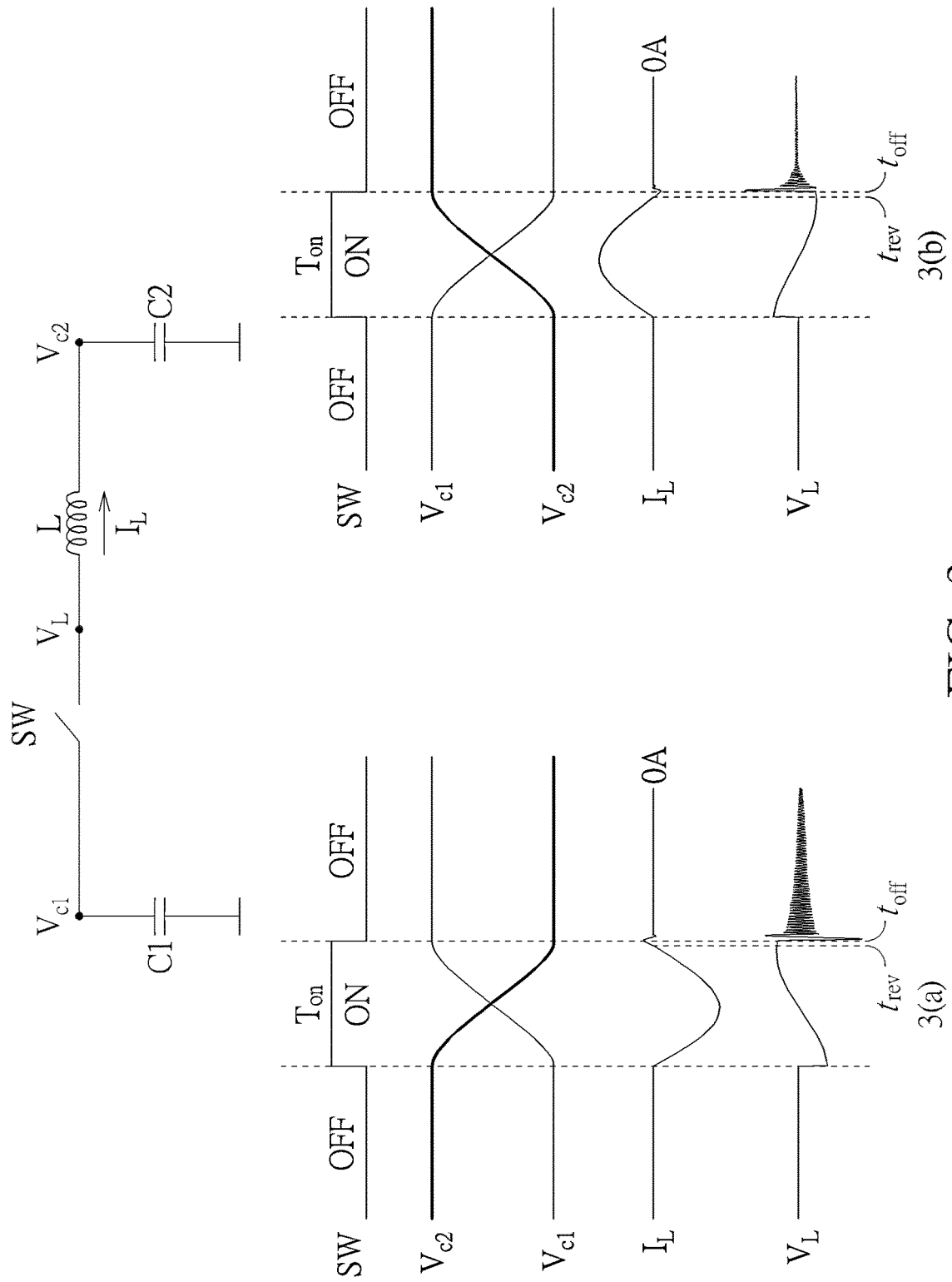
FIG. 3 illustrates inductor current and inductor voltage for conduction period being too long.

On the other hand, FIG. 3 illustrates inductor current $I_L$ and inductor voltage $V_L$ for conduction period $T_{on}$ being too long, which means $t_{off} > t_{rev}$, where $t_{off}$ represents the switch turned off time and $t_{rev}$ represents inductor current reversion time (at which magnitude of inductor current return to zero). FIG. 3(a) illustrates a scenario of $V_{c2} > V_{c1}$, the inductor current $I_L$ from C2 to C1, i.e., negative at beginning of the conduction period $T_{on}$; FIG. 3(b) illustrates a scenario of $V_{c1} > V_{c2}$, the inductor current $I_L$ from C1 to C2, i.e., positive at beginning of the conduction period $T_{on}$.

As shown in FIG. 3(a), a positive reversed inductor current $I_L$ would produce a negative spike on inductor voltage $V_L$ at time $t_{off}$. As shown in FIG. 3(b), a negative reversed inductor current $I_L$ would produce a positive spike on inductor voltage $V_L$ at time $t_{off}$.

From FIG. 2 and FIG. 3, it can be concluded that whether the conduction period $T_{on}$ is too short or too long can be inferred according to behavior of voltages $V_{c1}$, $V_{c2}$ and $V_L$.

Figure 4:
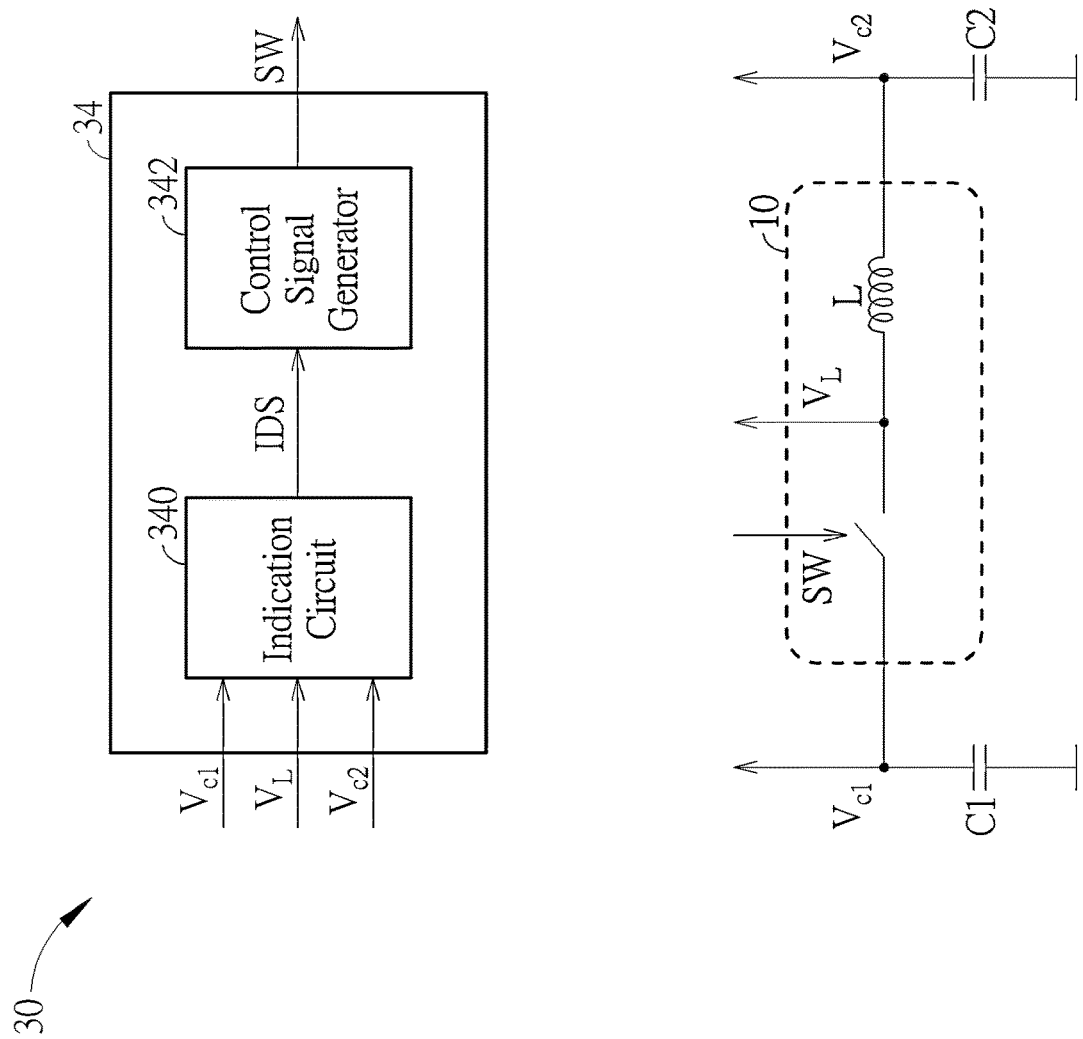
FIG. 4 illustrates a period determination circuit coupled to an energy recycling circuit according to an embodiment of the present application.

FIG. 4 illustrates a period determination circuit 34 coupled to the energy recycling circuit 10 (being a portion of a modulation signal generator 30 which will be mentioned later) according to an embodiment of the present application, where interconnections between the circuits 10 and 34 are omitted for brevity. The period determination circuit 34, configured to determine conduction period $T_{on}$ for energy-recycling circuit, is coupled to the capacitive components C1, C2 and the inductor L, to receive voltage $V_{c1}$ corresponding to C1, voltage $V_{c2}$ corresponding to C2 and inductor voltage $V_L$.

Furthermore, the period determination circuit 34 may comprise an indication circuit 340 and a control signal generator 342. The indication circuit 340 may generate the indication signal IDS to indicate current (first) conduction period $T_{on,n}$ is too short when the spike is toward positive and $V_{c1} > V_{c2}$ at time $t_{off}$ or when the spike is toward negative and $V_{c1} < V_{c2}$ at time $t_{off}$. On the other hand, the indication circuit 340 may generate the indication signal IDS to indicate current (first) conduction period $T_{on,n}$ is too long when the spike is toward negative and $V_{c1} > V_{c2}$ at time $t_{off}$ or when the spike is toward positive and $V_{c1} < V_{c2}$ at time $t_{off}$. Note that, the switch turned off time $t_{off}$ is corresponding to a spike time or corresponding to a time at which the spike achieves its peak.

Similar to 202, the control signal generator 342 generates the control signal SW with lengthened conduction period $T_{on,n+1}$ with $T_{on,n+1} > T_{on,n}$ when the control signal generator 342 receives the indication signal IDS indicating the current conduction period $T_{on,n}$ is too short, and generates the control signal SW with shortened conduction period $T_{on,n+1}$ with $T_{on,n+1} < T_{on,n}$ when the control signal generator 342 receives the indication signal IDS indicating the current conduction period $T_{on,n}$ is too long.

Figure 5:
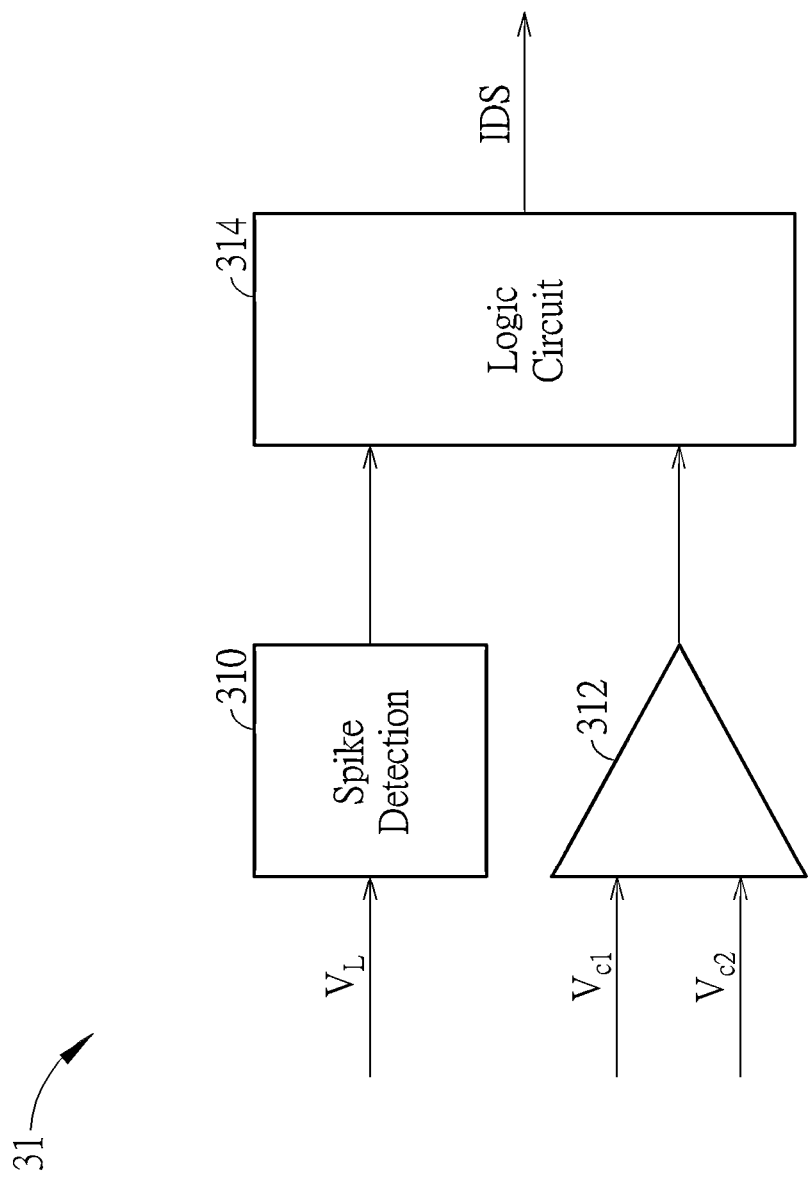
FIG. 5 is a schematic diagram of an indication circuit according to an embodiment of the present application.

FIG. 5 is a schematic diagram of an indication circuit 31 according to an embodiment of the present application. The indication circuit 31 may be used to realize the indication circuit 340. The indication circuit 31 may comprise a spike detection circuit 310, a comparator 312 and a logic circuit 314. The spike detection circuit 310 is configured to detect whether a spike occurs and determine a polarity of the spike when the spike occurs. The comparator 312 is configured to compare $V_{c1}$ and $V_{c2}$. The logic circuit 314 produces the indication signal IDS according to a detection result produced by the spike detection circuit 310 and a comparison result produced by the comparator 312.

The period determination circuit 34 based on observations from FIG. 2 and FIG. 3 may be suitable for energy-recycling circuit disposed within driving circuit configured to drive an air-pulse generating (APG) device to produce an amplitude-modulated ultrasonic air pressure variation with an ultrasonic carrier frequency (please see U.S. Pat. No. 12,075, 213). That is, the period determination circuit 34 may be coupled/applied to the energy-recycling circuit within the modulation signal generator disclosed in application Ser. No. 18/396,678 or within the driving circuit disclosed in U.S. Pat. No. 12,107,546, generating modulation driving signal SM or produce a generalized double sideband with suppressed carrier (DSB-SC) signal.

Figure 6:
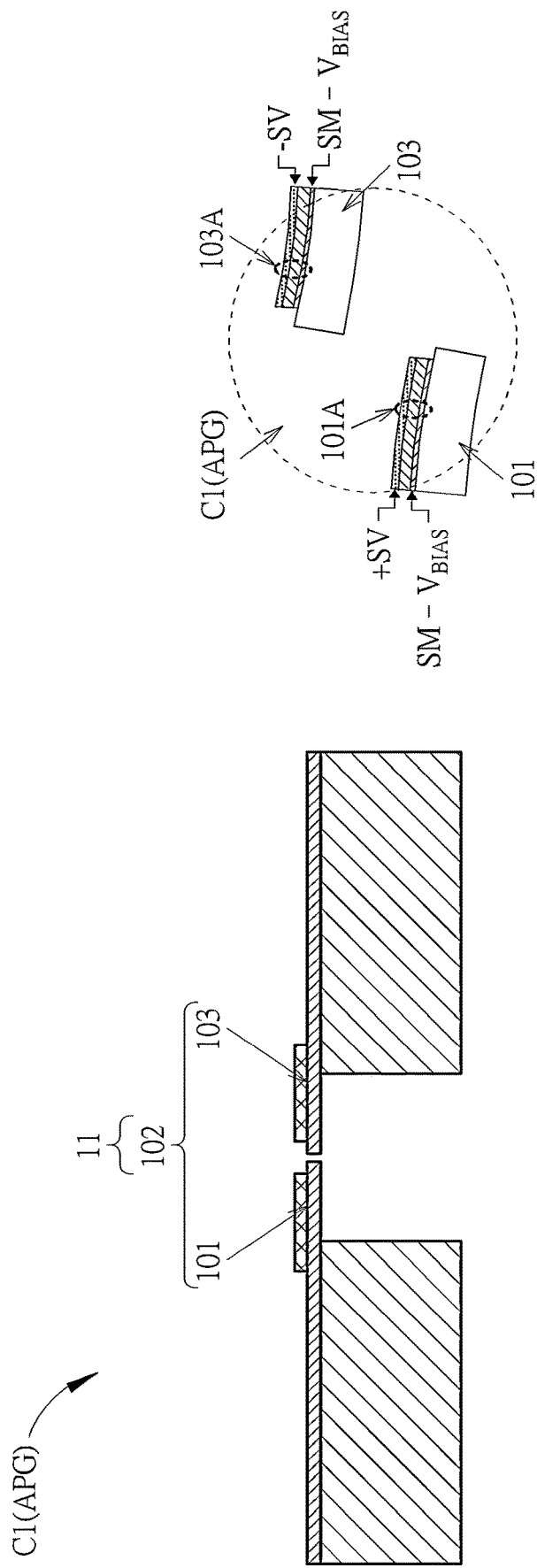
FIG. 6 illustrates a schematic diagram of a capacitive component according to an embodiment of the present application.

Specifically, FIG. 6 illustrates a schematic diagram of the capacitive component C1 or an APG device according to an embodiment of the present application. The capacitive component C1 or the APG device may comprise a film structure 11. The film structure 11 comprises a flap pair 102, and the flap pair 102 comprises flaps 101 and 103. In the embodiment shown in FIG. 6, the flap pair 102 may be driven by a modulation driving signal SM to perform the common mode movement and be driven by the demodulation driving signals ±SV to perform the differential mode movement, so as to achieve a collocation of modulation and demodulation or an in-situ modulation and demodulation, which means that both modulation and demodulation are performed by the same portion/location of film structure.

Furthermore, the capacitive component C1 or the APG device may comprise an actuator 101A disposed on the flap 101 and an actuator 103A disposed on the flap 103. Each of the actuators 101A and 103A may comprise piezoelectric material such as PZT (Lead Zirconate Titanate) sandwiched between a top electrode and a bottom electrode.

Details of the operational principles of the APG device have been taught in U.S. Pat. No. 12,075,213, which would not be narrated herein for brevity. In short, the period determination circuit 34 may be coupled to the driving circuit producing the modulation driving signal SM.

On the other hand, the period determination circuit of the present application may also be coupled/applied to the energy-recycling circuit within the demodulation signal generator disclosed in U.S. application Ser. No. 18/396,678 producing the demodulation driving signals ±SV.

Figure 7:
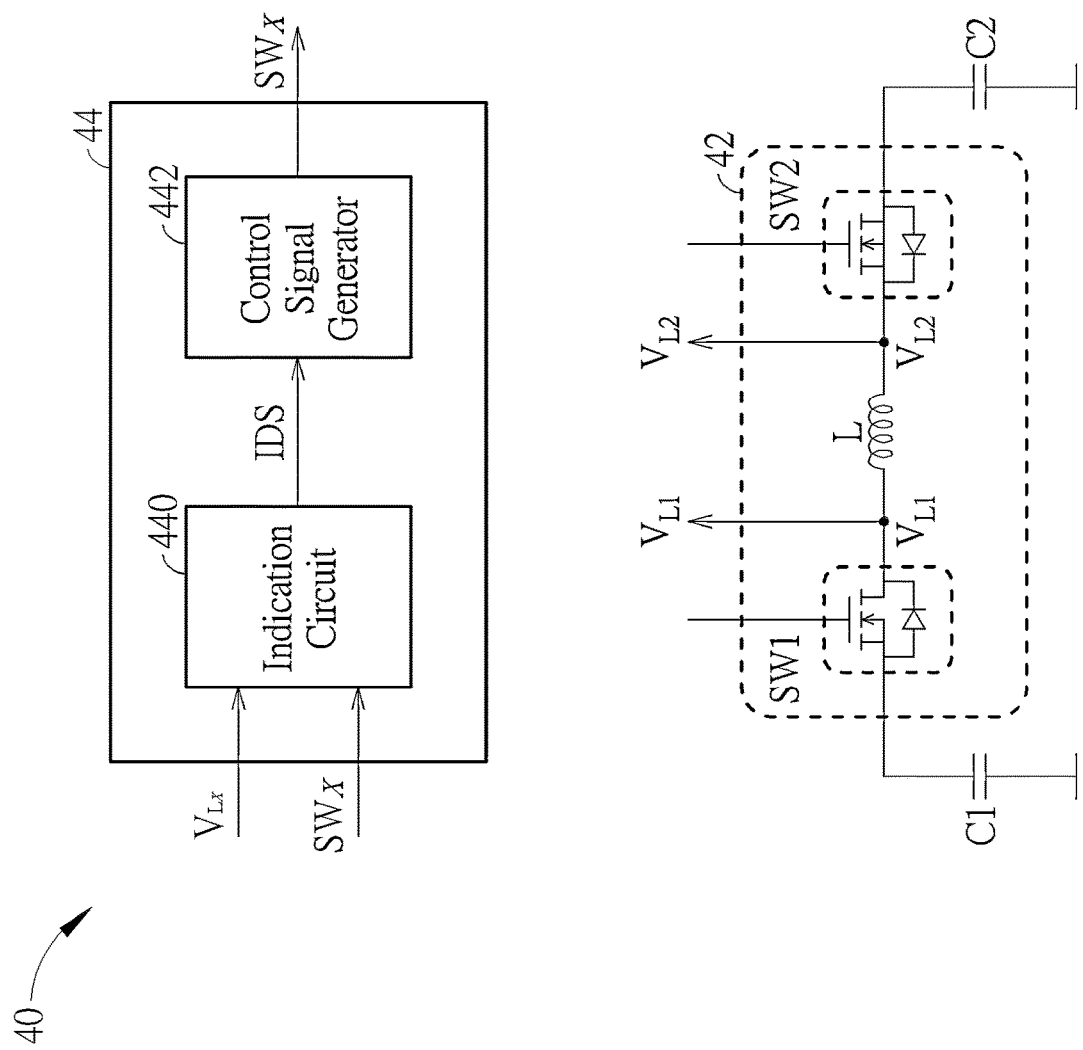
FIG. 7 illustrates a period determination circuit coupled to an energy-recycling circuit according to an embodiment of the present application.

For example, FIG. 7 illustrates a period determination circuit 44 coupled to an energy-recycling circuit 42 being a portion of a demodulation signal generator 40 according to an embodiment of the present application. The period determination circuit 44 comprises an indication circuit 440 and a control signal generator 442. In general, the indication circuit 440 receives an inductor voltage $V_{Lx}$ and a control signal SWx and generate indication signal IDS accordingly. The control signal generator 442 produces control signal for switch SWx, for x=1 or 2. Again, interconnections between the energy-recycling circuit 42 and the period determination circuit 44 are omitted for brevity.

The demodulation signal generator 40 (the energy-recycling circuit 42) is configured to generate the demodulation driving signals ±SV, as taught in application Ser. No. 18/396, 678. Different from Ser. No. 18/396,678, the demodulation signal generator 40 further comprises the period determination circuit 44, configured to produce control signals SW1 and SW2 for switches SW1 and SW2 within the energy-recycling circuit 42.

In FIG. 7, the first capacitive component C1 coupled to the energy-recycling circuit 42 may be the actuator 101A disposed on the flap 101, and the second capacitive component C2 coupled to the energy-recycling circuit 42 may be the actuator 103A disposed on the flap 103.

Figure 8:
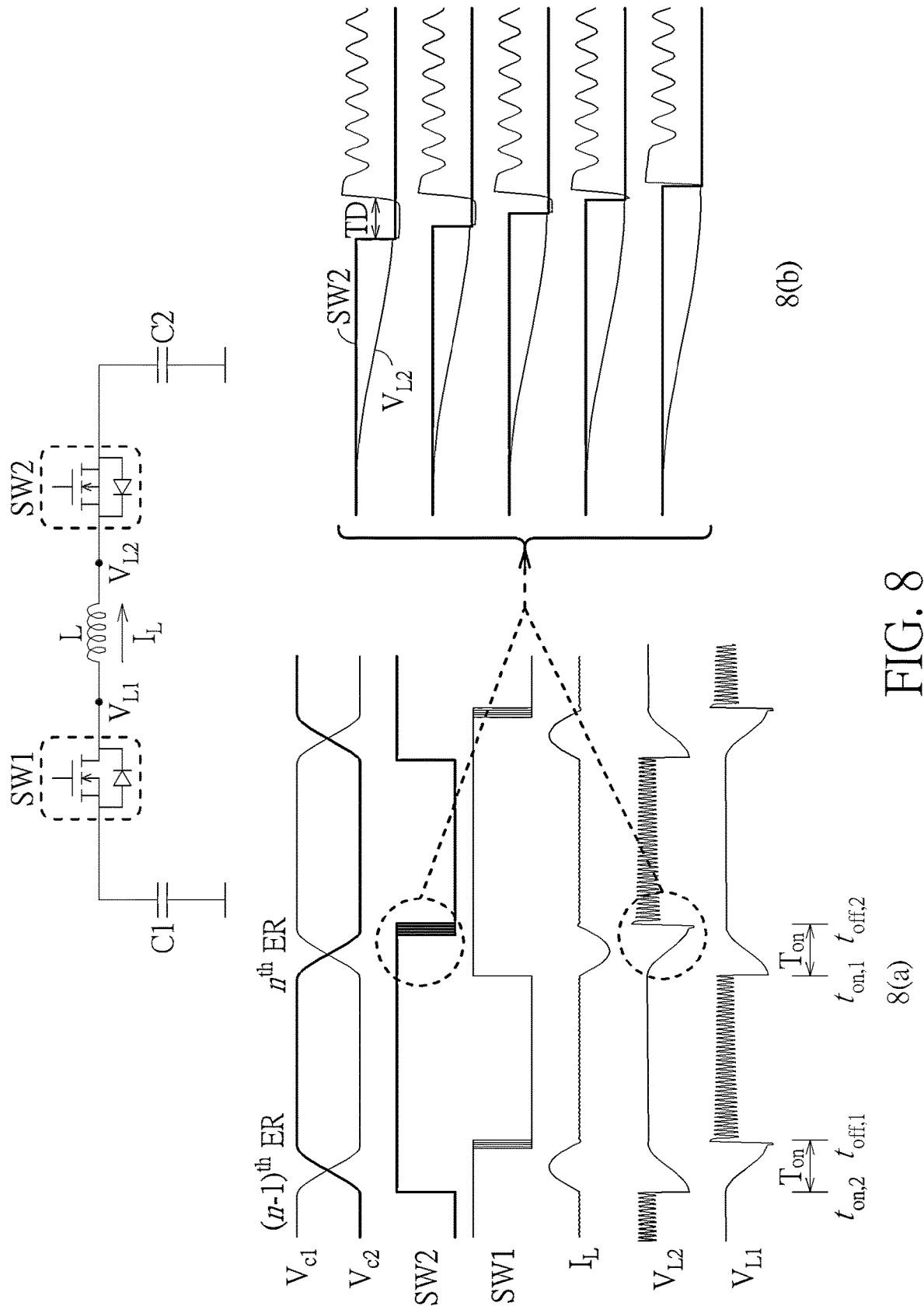
FIG. 8 illustrates waveforms of voltages, control signals, inductor current and inductor voltage.

FIG. 8 illustrates waveforms of voltages $V_{c1}$, $V_{c2}$, control signals SW1 and SW2, inductor current $I_L$ and inductor voltages $V_{L1}$ and $V_{L2}$. The waveforms shown in FIG. 8 are obtained from simulations or experiments. Specifically, FIG. 8(a) illustrates waveforms of the control signals SW1 and SW2 with multiple turned off times $t_{off,2}$, and FIG. 8(b) illustrates waveforms of inductor voltage $V_{L2}$ in response to control signal SW2 for various turned off times $t_{off,2}$.

Note that, in an embodiment, the conduction period can be terminated by turning off the switch SWx where one voltage $V_{cx}$ is lower than another. For example, at the end of the $(n-1)^{th}$ energy recycling (ER) operation, the switch SW1 is turned off since $V_{c1} < V_{c2}$; at the end of the $n^{th}$ ER operation, the switch SW2 is turned off since $V_{c2} < V_{c1}$. Hence, the conduction time $T_{on}$ of the $(n-1)^{th}$ ER operation is determined by $t_{off,1} - t_{on,2}$, and the conduction time $T_{on}$ of the $n^{th}$ ER operation is determined by $t_{off,2} - t_{on,1}$. Note that $t_{on/off,x}$ refers to turned on/off time of the switch SWx.

Note that, the conduction time $T_{on}$ may be lengthened by postponing the turned off time $t_{off,x}$ or be shortened by preponing the turned off time $t_{off,x}$ (assuming turned on time $t_{on,x}$ is unchanged).

There is a time difference, denoted as TD, between a falling time/edge of the control signal SW2 and a rising time of the inductor voltage $V_{L2}$. From FIG. 8(b), it can be seen that the time difference TD increases as the switch SW2 is turned off earlier and decreases as the switch SW2 is cutoff later. In an embodiment, the period determination circuit 44 may obtain/have a predetermined time difference $TD_{pre}$ stored therein (in advance, before the demodulation signal generator 40 operates). After the $n^{th}$ energy recycling operation done by energy-recycling circuit 42, the period determination circuit 44 may obtain a time difference $TD_n$ corresponding to the $n^{th}$ energy recycling operation. The period determination circuit 44 may compare the time difference $TD_n$ with the predetermined time difference $TD_{pre}$.

If $TD_n > TD_{pre}$ (meaning that the turn off time $t_{off,2}$ of the switch SW2 is too early or equivalently the conduction time $T_{on,n}$ is too short), the indication circuit 440 generates the indication signal indicating that the switch SW2 is turned off too early or the conduction time $T_{on,n}$ is too short, and the control signal generator 442 would postpone the turn off time $t_{off,2}$ for the next/subsequent (e.g., the $(n+1)^{th}$ or the $(n+2)^{th}$) energy recycling operation or equivalently lengthen the conduction time $T_{on}$ such that $T_{on,\ (n+1)} > T_{on,n}$ or $T_{on,\ (n+2)} > T_{on,n}$.

If $TD_n < TD_{pre}$ (meaning that the turn off time $t_{off,2}$ of the switch SW2 is too late or equivalently the conduction time $T_{on,n}$ is too long), the indication circuit 440 generates the indication signal indicating that the switch SW2 is turned off too late or the conduction time $T_{on,n}$ is too long, and the control signal generator 442 would prepone the turn off time $t_{off,2}$ for the next/subsequent (e.g., the $(n+1)^{th}$ or the $(n+2)^{th}$) energy recycling operation or equivalently shorten the conduction time $T_{on}$ such that $T_{on,\ (n+1)} < T_{on,n}$ or $T_{on,\ (n+2)} < T_{on,n}$.

The predetermined time difference $TD_{pre}$ may be obtained by simulations or experiments, which may be an optimized time difference TD in terms of optimized power loss or optimized efficiency. As a rule of thumb, the predetermined time difference $TD_{pre}$ may be chosen between 15~30 ns (nanosecond).

Figure 9:
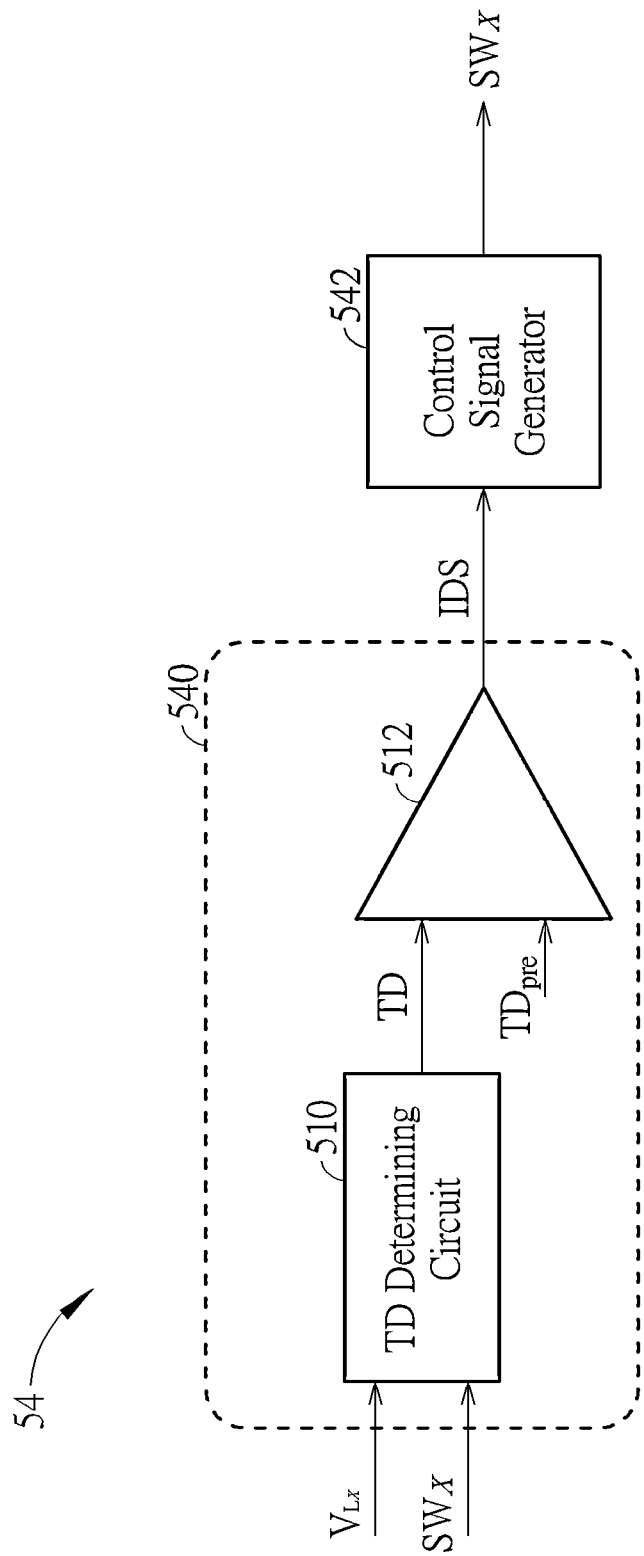
FIG. 9 illustrates a schematic diagram of a period determination circuit according to an embodiment of the present application.

FIG. 9 illustrates a schematic diagram of a period determination circuit 54 according to an embodiment of the present application. The period determination circuit 54 may be used to realize the period determination circuit 44. The period determination circuit 54 comprises an indication circuit 540 and a control signal generator 542.

The indication circuit 540 comprises a TD determining circuit 510 and a comparator 512. The TD determining circuit 510 receives the inductor voltage $V_{Lx}$ and the control signal SWx. Generally, the inductor voltage $V_{Lx}$ may be referred to $V_{L1}$ or $V_{L2}$ and the control signal SWx may be referred to SW1 or SW2 in FIG. 9, where $V_{Lx}$ is the node coupled to and between the inductor L and the switch SWx. According to the inductor voltage $V_{Lx}$ and the control signal SWx, the TD determining circuit 510 determines the time difference TD or $TD_n$ corresponding to the $n^{th}$ (current/first) energy recycling operation. The comparator 512 compares the time difference $TD/TD_n$ with the predetermined time difference $TD_{pre}$, and the comparison result from the comparator 512 may be viewed as a kind of indication signal IDS. According to the indication signal IDS, the control signal generator 542 would renew the control signal SWx for the next/subsequent (e.g., the $(n+1)^{th}$ or the $(n+2)^{th}$) energy recycling operation.

In short, the present invention is able to adaptively adjust energy-recycling period (i.e., conduction period), which can accommodate capacitive load(s) with various capacitance(s).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A period determination circuit for determining a conduction period for an energy-recycling circuit, the period determination circuit comprising:
   an indication circuit, coupled to an inductor of the energy-recycling circuit to receive an inductor voltage, configured to generate an indication signal according to the inductor voltage, wherein the indication signal reflects a status corresponding to a first conduction period of the energy-recycling circuit; and
   a control signal generator, coupled to a switch of the energy-recycling circuit, configured to generate a control signal with a second conduction period for the switch according to the indication signal;
   wherein the energy-recycling circuit is coupled to a first capacitive component and a second capacitive component;
   wherein the energy-recycling circuit comprises the inductor and the switch coupled between the first capacitive component and the second capacitive component;
   wherein the control signal generator determines the second conduction period according to the first conduction period and the indication signal.

2. The period determination circuit of claim 1,
   wherein the indication circuit comprises a spike detection circuit;
   wherein the spike detection circuit is coupled to the inductor to receive the inductor voltage.

3. The period determination circuit of claim 2,
   wherein the indication circuit generates the indication signal according to a polarity of a spike detected by the spike detection circuit.

4. The period determination circuit of claim 3,
   wherein the indication circuit generates the indication signal such that the control signal generator determines the second conduction period is longer than the first conduction period when the spike is toward positive and a first voltage corresponding to the first capacitive component is greater than a second voltage corresponding to the second capacitive component at a time corresponding to the spike.

5. The period determination circuit of claim 3,
   wherein the indication circuit generates the indication signal such that the control signal generator determines the second conduction period is longer than the first conduction period when the spike is toward negative and a first voltage corresponding to the first capacitive component is less than a second voltage corresponding to the second capacitive component at a time corresponding to the spike.

6. The period determination circuit of claim 3,
   wherein the indication circuit generates the indication signal such that the control signal generator determines the second conduction period is shorter than the first conduction period when the spike is toward negative and a first voltage corresponding to the first capacitive component is greater than a second voltage corresponding to the second capacitive component at a time corresponding to the spike.

7. The period determination circuit of claim 3,
   wherein the indication circuit generates the indication signal such that the control signal generator determines the second conduction period is shorter than the first conduction period when the spike is toward positive and a first voltage corresponding to the first capacitive component is less than a second voltage corresponding to the second capacitive component at a time corresponding to the spike.

8. The period determination circuit of claim 1,
   wherein the indication circuit is coupled to the first capacitive component and the second capacitive component to receive a first voltage corresponding to the first capacitive component and receives a second voltage corresponding to the second capacitive component;
   wherein the indication circuit generates the indication signal according to the inductor voltage, the first voltage and the second voltage.

9. The period determination circuit of claim 8,
wherein the indication circuit compares the first voltage and the second voltage and generates the indication signal according to a comparison result between the first voltage and the second voltage.

10. The period determination circuit of claim 1,
wherein the energy-recycling circuit is disposed within a driving circuit configured to produce a generalized double sideband with suppressed carrier (DSB-SC) signal.

11. The period determination circuit of claim 1,
wherein the energy-recycling circuit is disposed within a driving circuit configured to drive an air-pulse generating device.

12. The period determination circuit of claim 1,
wherein the energy-recycling circuit is disposed within a driving circuit configured to drive an air-pulse generating device to produce an amplitude-modulated ultrasonic air pressure variation with an ultrasonic carrier frequency.

13. The period determination circuit of claim 1,
wherein the indication circuit obtains a time difference according to the inductor voltage and a first control signal with the first conduction period;
wherein the indication circuit compares the time difference with a predetermined time difference;
wherein the indication circuit generates the indication signal according to a comparison result between the time difference and the predetermined time difference.

14. The period determination circuit of claim 13,
wherein the indication circuit generates the indication signal such that the control signal generator determines the second conduction period is longer than the first conduction period when the time difference is greater than the predetermined time difference.

15. The period determination circuit of claim 13,
wherein the indication circuit generates the indication signal such that the control signal generator determines the second conduction period is shorter than the first conduction period when the time difference is less than the predetermined time difference.

16. The period determination circuit of claim 1,
wherein the energy-recycling circuit is disposed within a driving circuit configured to drive an air-pulse generating device to form an opening.

17. The period determination circuit of claim 1, wherein the indication circuit comprises a comparator.

18. The period determination circuit of claim 17,
wherein the comparator receives the first voltage and the second voltage and is configured to compare the first voltage and the second voltage.

19. The period determination circuit of claim 17,
wherein the comparator receives a time difference and a predetermined time difference and is configured to compare the time difference and the predetermined time difference.

20. The period determination circuit of claim 1,
wherein the first capacitive component comprises a first actuator disposed on a film structure.

21. The period determination circuit of claim 1,
wherein the first capacitive component comprises a first actuator disposed on a first flap within a film structure;
wherein the second capacitive component comprises a second actuator disposed on a second flap within the film structure.

22. The period determination circuit of claim 1,
wherein the energy-recycling circuit comprises a first switch coupled between the first capacitive component and the inductor and a second switch coupled between the second capacitive component and the inductor.

23. A period determination method of determining a conduction period for an energy-recycling circuit, the period determination method comprising:
receiving an inductor voltage corresponding to an inductor of the energy-recycling circuit;
generating an indication signal according to the inductor voltage, wherein the indication signal reflects a status corresponding to a first conduction period of the energy-recycling circuit;
determining a second conduction period according to the first conduction period and the indication signal; and
generating a control signal with the second conduction period for a switch of the energy-recycling circuit according to the indication signal;
wherein the energy-recycling circuit is coupled to a first capacitive component and a second capacitive component;
wherein the energy-recycling circuit comprises the inductor and the switch coupled between the first capacitive component and the second capacitive component.

24. The period determination method of claim 23, wherein the step of generating the indication signal according to the inductor voltage comprises:
performing a spike detection operation according to the inductor voltage; and
generating the indication signal according to a polarity of a spike detected in the spike detection operation.

25. The period determination method of claim 23, wherein the step of generating the indication signal according to the inductor voltage comprises:
comparing a first voltage corresponding to the first capacitive component and a second voltage corresponding to the second capacitive component; and
generating the indication signal according to a comparison result between the first voltage and the second voltage.

26. The period determination method of claim 23, wherein the step of generating the indication signal according to the inductor voltage comprises:
obtaining a time difference according to the inductor voltage and a first control signal with the first conduction period;
comparing the time difference with a predetermined time difference; and
generating the indication signal according to a comparison result between the time difference and the predetermined time difference.

* * * * *